US008865268B2

(12) United States Patent
Haque et al.

(10) Patent No.: US 8,865,268 B2
(45) Date of Patent: Oct. 21, 2014

(54) METHOD AND APPARATUS

(75) Inventors: Samiul Haque, Cambridge (GB); Reijo K. Lehtiniemi, Helsinki (FI); Asta M. Karkkainen, Helsinki (FI); Lorenz Lechner, Helsinki (FI); Pertti Hakonen, Helsinki (FI)

(73) Assignee: Nokia Corporation, Espoo (FI)

( * ) Notice: Subject to any disclaimer, the term of this patent is extended or adjusted under 35 U.S.C. 154(b) by 810 days.

(21) Appl. No.: 12/387,208

(22) Filed: Apr. 28, 2009

(65) Prior Publication Data

US 2010/0272917 A1  Oct. 28, 2010

(51) Int. Cl.
*C23C 14/04* (2006.01)
*H01L 29/16* (2006.01)
*H01B 1/04* (2006.01)

(52) U.S. Cl.
CPC .............. *H01B 1/04* (2013.01); *H01L 29/1606* (2013.01); *Y10S 977/855* (2013.01); *Y10S 977/856* (2013.01); *Y10S 977/857* (2013.01); *Y10S 977/858* (2013.01); *Y10S 977/859* (2013.01)
USPC ........... 427/526; 977/855; 977/856; 977/857; 977/858; 977/859

(58) Field of Classification Search
CPC ........ C23C 14/00; C23C 14/04; C23C 14/46; H01L 29/1606
USPC ........... 427/526; 977/855, 856, 857, 858, 859
See application file for complete search history.

(56) References Cited

U.S. PATENT DOCUMENTS

| 2004/0253820 A1 | 12/2004 | DeHeer et al. | 438/689 |
| 2007/0132043 A1* | 6/2007 | Bradley et al. | 257/414 |
| 2010/0032409 A1* | 2/2010 | Hong et al. | 216/41 |
| 2010/0051960 A1 | 3/2010 | Chen et al. | 257/76 |

FOREIGN PATENT DOCUMENTS

| JP | 2007335532 A | 12/2007 |
| JP | 2009155168 A | 7/2009 |
| WO | WO 2009158552 A1 | 12/2009 |

OTHER PUBLICATIONS

Komano et al, Silicon Oxide Film Formation by Focused Ion Beam (FIB)-Assisted Deposition, Nov. 1989, Japanese Journal of Applied Physics, vol. 28 No. 11, p. 2372-2375.*
Tao et al, Focused ion beam induced deposition of platinum, Nov./Dec. 1990, J. Vac. Sci. Technol. B, vol. 8 No. 6, pp. 1826-1829.*
A.K. Geim et al., "The Rise of Graphene", Nature Materials, vol. 6, Mar. 2007, pp. 183-191.
Jean-Francois Dayen et al., "Side-Gated Transport in FIB-Fabricated Multilayered Graphene Nanoribbons", Small, vol. 4, Issue 6, May 6, 2006, pp. 716-720.
Artur Bottcher et al., "Nanostructuring the Graphite Basal Plane by Focused Ion Beam Patterning and Oxygen Etching", Nanotechnology 17, Nov. 16, 2006, pp. 5889-5894.

* cited by examiner

*Primary Examiner* — Dah-Wei D Yuan
*Assistant Examiner* — Nga Leung V Law
(74) *Attorney, Agent, or Firm* — Harrington & Smith

(57) ABSTRACT

A method and apparatus, the method including: forming a recess in a graphene layer wherein the recess creates a boundary between a first portion of the graphene layer and a second portion of the graphene layer; depositing electrically insulating material within the recess; and depositing an electrically conductive material over the insulating material.

10 Claims, 4 Drawing Sheets

METHOD AND APPARATUS

FIELD OF THE INVENTION

Embodiments of the present invention relate to a method and apparatus. In particular, they relate to a method and apparatus for providing an electrical connection to a portion of a graphene layer.

BACKGROUND TO THE INVENTION

Graphene is a thin planar sheet of carbon atoms that are densely packed in a honeycomb lattice. FIG. 1 schematically illustrates the arrangement of carbon atoms within a graphene layer 1.

The graphene layer 1 illustrated in FIG. 1 comprises only a single layer of carbon atoms. Other graphene layers may comprise a plurality of overlaying layers of carbon atoms. The physical properties of a graphene layer may be dependent upon the number of overlaying layers of carbon atoms. The physical properties of the graphene may become less distinct as the number of atomic layers is increased. The physical properties may be most distinct for graphene comprising up to five atomic layers. If the material comprises more than about twenty atomic layers then the material may no longer be considered to be graphene but graphite instead.

Graphene has been shown to exhibit physical properties such as high charge carrier mobility with ballistic transport, high current density and high thermal conductivity. These properties may enable graphene to be used in microelectronic or nanoelectronic devices.

In order to enable graphene to be used in a microelectronic or nanoelectronic device it is necessary to prepare a suitable portion of graphene and enable a reliable electrical connection to be made to the graphene portion.

BRIEF DESCRIPTION OF VARIOUS EMBODIMENTS OF THE INVENTION

According to various, but not necessarily all, embodiments of the invention there is provided a method comprising: forming a recess in a graphene layer wherein the recess creates a boundary between a first portion of the graphene layer and a second portion of the graphene layer; depositing electrically insulating material within the recess; and depositing an electrically conductive material over the insulating material.

In some embodiments of the invention the method may comprise enabling an electrical connection to be made to the first portion of the graphene layer.

In some embodiments of the invention the recess may separate the first portion of the graphene layer from the second portion of the graphene layer.

In some embodiments of the invention the method may also comprise forming the recess using a focussed ion beam. In some embodiments of the invention the method may also comprise depositing the electrically insulating material within the recess using a focussed ion beam. In some embodiments of the invention the method may also comprise depositing the electrically conductive material using a focussed ion beam.

In some embodiments of the invention the recess may surround the first portion of the graphene layer.

In some embodiments of the invention the insulating material may comprise an oxide. The insulating material may comprise silicon dioxide. In other embodiments of the invention the insulating material may comprise a dielectric material with a high dielectric constant.

In some embodiments of the invention the electrically conductive material may comprise chromium alloy. In other embodiments of the invention the electrically conductive material may comprise a metal such as platinum, gold, tungsten or palladium.

In some embodiments of the invention the method may further comprise depositing a contact portion wherein the contact portion may provide an electrical connection between the first portion of the graphene layer and the electrically conductive material. The contact portion may comprise a different material to the electrically conductive material. The contact portion may comprise palladium. In some embodiments of the invention the contact portion may comprise platinum, gold, tungsten or any metal suitable for use in a microelectronics or nanoelectronic device According to various, but not necessarily all, embodiments of the invention there is provided an apparatus comprising; a graphene layer comprising a first portion and a second portion where a recess creates a boundary between the first portion and the second portion; an electrically insulating material within the recess: and an electrically conductive material over the insulating material.

In some embodiments of the invention the electrically conductive material may enable an electrical connection to be made to the first portion of the graphene layer.

In some embodiments of the invention the first portion is separated from the second portion by the recess.

In some embodiments of the invention the recess may be formed using a focussed ion beam. In some embodiments of the invention the electrically insulating material may be deposited within the recess using a focussed ion beam. In some embodiments of the invention the electrically conductive material may be deposited using a focussed ion beam.

In some embodiments of the invention the recess may surround the first portion of the graphene layer.

In some embodiments of the invention the insulating material may comprise an oxide. The insulating material may comprise silicon dioxide. In other embodiments of the invention the insulating material may comprise a dielectric material with a high dielectric constant.

In some embodiments of the invention the electrically conductive material may comprise chromium alloy. In other embodiments of the invention the electrically conductive material may comprise a metal such as platinum, gold, tungsten or palladium.

In some embodiments of the invention the apparatus may comprise a contact portion configured to provide an electrical connection between the first portion of the graphene layer and the electrically conductive material. The contact portion may comprise a different material to the electrically conductive material. The contact portion may comprise palladium. In some embodiments of the invention the contact portion may comprise platinum, gold, tungsten or any metal suitable for use in a microelectronic or nanoelectronic device.

The apparatus may be for use in a microelectronic or nanoelectronic device.

BRIEF DESCRIPTION OF THE DRAWINGS

For a better understanding of various examples of embodiments of the present invention reference will now be made by way of example only to the accompanying drawings in which.

DETAILED DESCRIPTION OF VARIOUS EMBODIMENTS OF THE INVENTION

Figure 1:
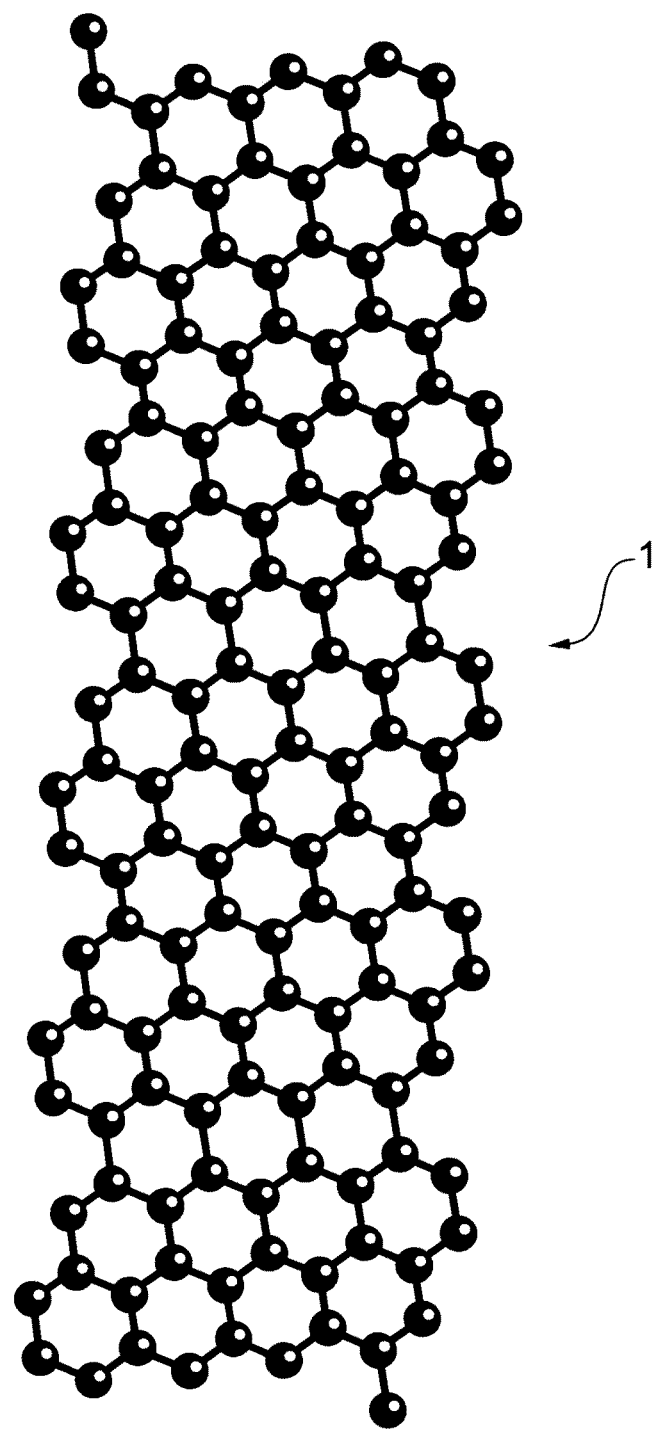
FIG. 1 is a schematic illustration of a layer of graphene.

The Figures illustrate a method comprising: forming 13 a recess 23 in a graphene layer 1 wherein the recess 23 creates a boundary between a first portion 25 of the graphene layer 1 and a second portion 27 of the graphene layer 1; depositing 17 electrically insulating material 29 within the recess 23; and depositing 19 an electrically conductive material 31 over the insulating material 29.

As mentioned above FIG. 1 illustrates a layer 1 of graphene. The graphene layer 1 may be formed by any suitable method such as mechanical exfoliation of a layer of graphite or growing epitaxial layers from a crystal base.

The carbon atoms of the graphene layer 1 form a regular honeycomb crystal lattice. The regular crystal lattice gives rise to a band structure and enables the graphene layer 1 to exhibit semiconductor properties. The edge of the graphene layer 1 is a discontinuity which disrupts the regular crystal lattice. This affects the band structure, and consequently the semiconductor properties, of the graphene layer 1.

Figure 2:
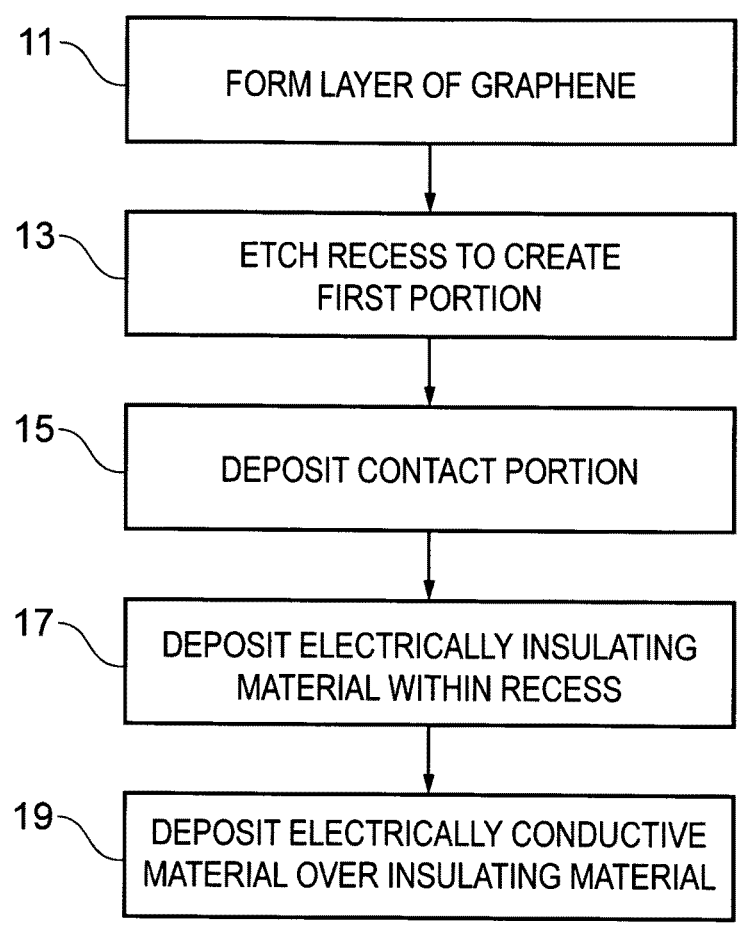
FIG. 2 illustrates of a flow chart of a method according to an embodiment of the invention.

FIG. 2 illustrates a flow chart of a method of creating an electrical connection to a portion of a graphene layer 1 according to an embodiment of the invention.

At block 11 a graphene layer 1 is formed. As mentioned above the graphene layer 1 may be formed by mechanical exfoliation of a layer of graphite or growing epitaxial layers from a crystal base. In other embodiments of the invention other methods of forming the graphene layer 1 may be used.

The thickness of the graphene layer 1 may depend upon the methods used to prepare the layer 1 and also the intended application of the layer 1. The graphene layer 1 may comprise between one and twenty overlaying layers of carbon atoms. In most embodiments of the invention the graphene layer 1 may comprise between one and five overlaying layers of carbon atoms.

At block 13 a recess 23 is formed within the graphene layer 1. The recess 23 is an incision in the surface of the graphene layer 1 which is formed by etching away some of the carbon atoms of the graphene layer 1. In some embodiments of the invention the recess 23 may be etched through part of the thickness of the graphene layer 1. For example, where the graphene layer 1 comprises a plurality of atomic layers the recess 23 may only be etched through the upper atomic layers. In other embodiments of the invention the recess 23 may be etched through the entire thickness of the graphene layer 1.

In some embodiments of the invention the recess 23 may be formed 13 using a focused ion beam microscope. In such embodiments the depth and width of the recess 23 may depend upon the resolution of the microscope or the focussed ion beam equipment.

The recess 23 creates a boundary between the first portion 25 of the graphene layer 1 and the second portion 27 of the graphene layer 1. The boundary may be a dividing line between the two portions.

In some embodiments of the invention the recess 23 may separate the first portion 25 of the graphene layer 1 from the second portion 27 of the graphene layer 1. In some embodiments of the invention the recess 23 may extend around the entire first portion 25 of the graphene layer 1 and define the perimeter of the first portion 25. The shape and size of the first portion 25 of the graphene layer 1 may depend upon the resolution of the apparatus used to create the recess 23 or the intended application of respective portions of the graphene layer 1.

In some embodiments of the invention the recess 23 may only extend around a section of the first portion 25 of the graphene layer 1. In these embodiments the first portion 25 may be connected to the second portion 27.

At block 15 contact portions 21 are deposited on the first portion 21 of the graphene layer 1. The contact portions 21 are configured to enable an electrical connection to be made between the first portion 25 of the graphene layer 1 and other electrical components so the first portion 25 of the graphene layer 1 may form part of an electric circuit.

The contact portions 21 comprise an electrically conductive material, for example, a metal such as palladium, platinum, gold, tungsten or any other material suitable for use in a microelectronic or nanoelectronic device.

The contact portions 21 may be deposited using any suitable technique such as focussed ion beam deposition. In such embodiments the size of the contact portions 21 may be determined by the resolution of the focussed ion beam.

The contact portions 21 may be deposited at any suitable location of the first portion 25 of the graphene layer 1. In some embodiments of the invention the contact portions may be positioned at the edge of the first portion 25 of the graphene layer 1.

At block 17 electrically insulating material 29 is deposited within the recess 23. The electrically insulating material 29 creates an insulating barrier between the first portion 25 and the second portion 27 of the graphene layer 1.

The electrically insulating material 29 may comprise any suitable material for example an oxide such as silicon dioxide or a dielectric material with a high dielectric constant.

The electrically insulating material 29 may be deposited using a focussed ion beam microscope. The position and thickness of the layer of insulating material 29 may depend upon the technique used to deposit the electrically insulating material 29 and the intended application of the graphene layer 1.

In some embodiments of the invention the electrically insulating material 29 may be deposited within the recess 23 so that the top of the insulating material 29 is approximately level with the surface of the graphene layer 1. In other embodiments of the invention the electrically insulating material 29 may be deposited so that some of the insulating material 29 is within the recess 23 and some of the insulating material 29 overlays sections of the surface of the graphene layer 1.

At block 19 an electrically conductive material 31 is deposited over the electrically insulating material 29 to enable an electrical connection to be made to the first portion 25 of the graphene layer 1.

The electrically conductive material 31 may be deposited so that it adjoins the contact portions 21 and so is electrically connected to the contact portions 21. In some embodiments of the invention the electrically conductive material 31 may be formed from the same material as the contact portions 21. In other embodiments of the invention the electrically conductive material 31 may be formed from a different material to the contact portions 21. For example the electrically conductive material 31 may be required to have specific properties such as superconductivity or mechanical properties which enable it to be used to form a connecting wire. In some embodiments of the invention electrically conducive material 31 may comprise a chromium alloy.

The electrically conductive material 31 enables the first portion 25 of the graphene layer 1 to be connected to other electronic components to form part of an electronic circuit. In some embodiments of the invention the other electronic components may comprise other portions of the graphene layer 1.

Figure 3:
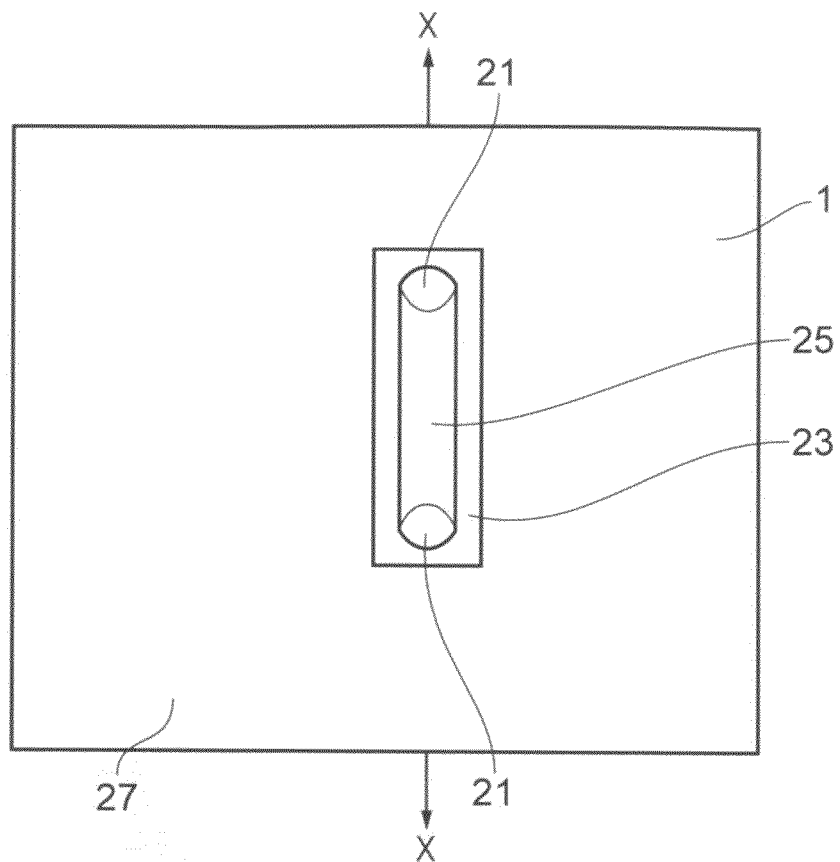
FIG. 3 is a schematic diagram of a first portion of a graphene layer according to an embodiment of the invention.

FIG. 3 is a schematic diagram of a graphene layer 1 according to an embodiment of the invention in which part of the above described method has been carried out. A recess 23 has been formed 13 to separate a first portion 25 of the graphene layer 1 from a second portion 27 of the graphene layer 1 and contact portions 21 have been deposited 15 on the first portion of the graphene layer 1.

Figure 4:
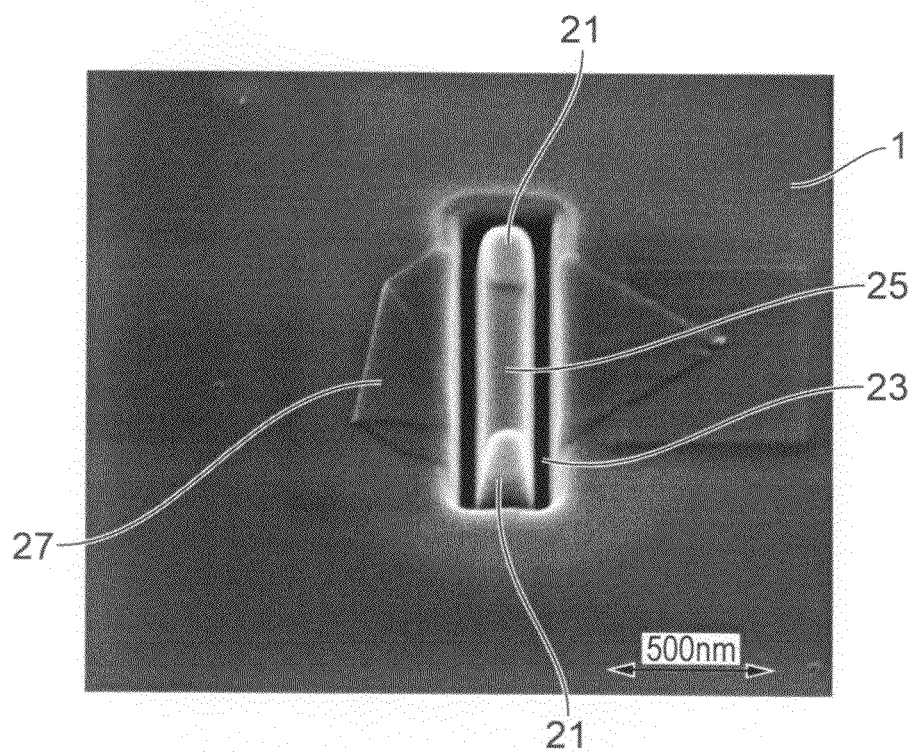
FIG. 4 is a scanning electron microscope (SEM) micrograph of a first portion of a graphene layer according to an embodiment of the invention.

FIG. 4 is an SEM micrograph of a graphene layer 1 corresponding to the schematic illustration of FIG. 3. The same reference numerals are used for the corresponding features. The dimensions of the features of the graphene layer 1 can be determined from the scale indicated in the micrograph.

In FIGS. 3 and 4 the first portion 25 is enclosed by the second portion 27 of the graphene layer 1. The recess 23 surrounds the first portion 25 and separates the first portion 25 from the second portion 27. The recess 23 forms a rectangle in the surface of the graphene layer 1. As the recess 23 defines the perimeter of the first portion 25 the first portion 25 is also rectangular.

In the illustrated embodiment the length of the first portion 25 is much greater than the width of the first portion 23 so that the rectangle is elongate. In FIG. 4 the first portion 25 of the graphene layer 1 has a length of approximately 800 nm and a width of approximately 150 nm. Graphene portions having similar elongated shapes are known as graphene nanoribbons.

It is to be appreciated that in other embodiments of the invention the first portion 25 of the graphene layer may have a different size and/or shape. For example a graphene nanoribbon may have a length between 100 and 2000 nm. The width of a graphene nanoribbon may be less than 10 nm. The exact size and shape used may depend upon a number of factors including the accuracy and resolution of the apparatus used to created the recess 23 and the intended application of the respective portions of the graphene layer 1.

In some embodiments of the invention quantum dots may be formed from a graphene nanoribbon by changing the width of the nanoribbon at selected points along the length of the nanoribbon. A focused ion beam may be used to change the width of the nanoribbon. This may change the electronic properties of the nanoribbon, for example, it may create quantum confinement.

Graphene nanoribbons may have either armchair or zigzag edge states. These depend on the arrangement of the atoms at the edge of the nanoribbon. Zigzag edges have one atom at the edge whereas armchair edges have two atoms at the edge. The electronic properties of the nanoribbon depend on whether the edges are zigzag or armchair.

In the illustrated embodiment the width of the recess 23 is approximately 10 nm. As mentioned above, the width of the recess may be determined by the resolution of the apparatus used to create the recess 23.

The contact portions 21 are deposited on the upper surface of the first portion 25 of the graphene layer 1. In some embodiments of the invention the contact portions 21 may be positioned on the side of the first portion 25 of the graphene layer 1.

The contact portions 21 are positioned at either end of the first portion 25 so that they are separated along the length of the elongate rectangular first portion 25.

The size of the contact portions 21 may be determined by the resolution of the apparatus used to deposit the contact portions 21. In some embodiments of the invention the diameter of the contact portions 21 may be around 10 nm. The thickness of the contact portions 21 may also be dependent upon the technique used to deposit the contact portion 21 and the intended application of the graphene layer 1.

Figure 5:
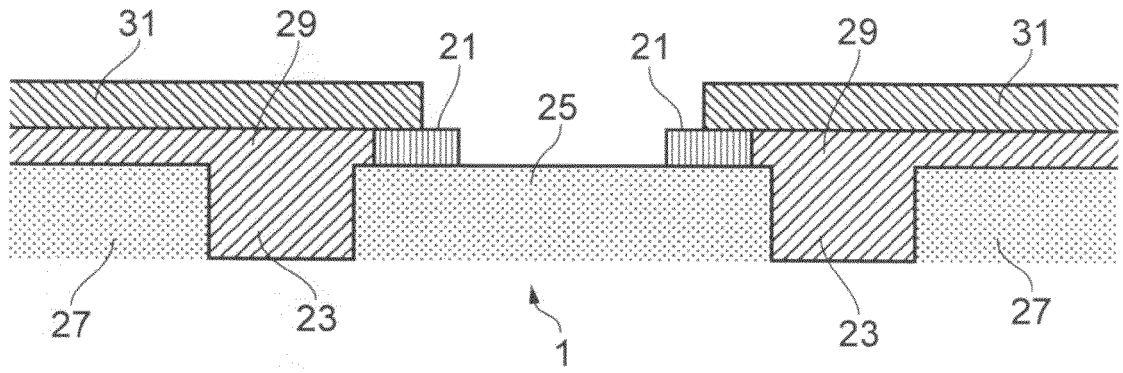
FIG. 5 is a schematic diagram of an apparatus according to an embodiment of the invention.

FIG. 5 is a schematic illustration of an apparatus 33 according to an embodiment of the invention. FIG. 5 is a cross section of the completed apparatus 33 through the line X-X illustrated in FIG. 3. The relative dimensions in FIG. 5 may not correspond to the actual relative dimensions of the apparatus 33.

The apparatus 33 comprises a first portion 25 of a graphene layer 1 and a second portion 27 of the graphene layer 1. A recess 23 separates the first portion 25 from the second portion 27.

Electrically insulating material 29 is deposited within the recess 23. In the illustrated embodiment the electrically insulating material 29 also overlays some of the surface of the first portion 25 and also the second portion 27 of the graphene layer 1. This insulates the sections of the graphene layer 1 from any electrically conductive material 31 which is deposited over the insulating material 29.

Two contact portions 21 are provided, as in FIGS. 3 and 4, at either end of the first portion 25 of the graphene layer 1. The contact portions 21 make electrical contact with the first portion 25 of the graphene layer 1.

A layer of electrically conductive material 31 is deposited over the electrically insulating material 29. In the illustrated embodiment the electrically conductive material adjoins the contact portions 21 by overlaying a section of the contact portions 21 and so is electrically connected to the contact portions 21. As the electrically conductive material 31 overlays the electrically insulating material 29 it is electrically isolated from the second portion of the graphene layer 1.

Figure 6:
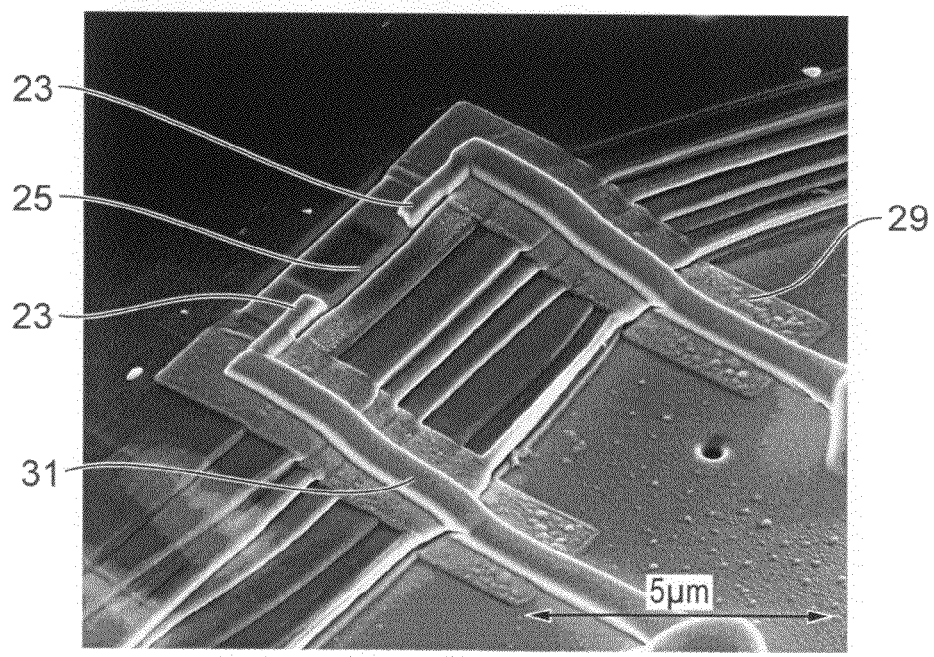
FIG. 6 is an SEM micrograph of an apparatus according to an embodiment of the invention.

FIG. 6 is an SEM micrograph of an apparatus 33 according to an embodiment of the invention. The same reference numerals are used for the features corresponding to the features described in the previous embodiments. The dimensions of the apparatus can be seen from the scale provided.

In FIG. 6 the first portion 25 of the graphene layer 1 is also an elongate rectangle however in FIG. 6 the first portion is positioned at the edge of the graphene layer 1 so that the recess 23 only extends around three sides of the rectangular first portion 25.

The electrically insulating material 29 is deposited within the recess 23 and also over the surface of the second portion 27 of the graphene layer. The electrically conductive material is then deposited over the electrically insulating material.

In FIG. 6 the layer of the electrically insulating material 29 is much wider than the layer of the electrically conductive material 31. This reduces the accuracy needed when depositing the electrically conductive material 31.

Embodiments of the invention provide an accurate and reliable method of enabling an electrical contact to be made to a graphene layer. The method used enables the size and shape of the graphene portions to be determined by the user so they may be adjusted depending on the intended application of the graphene layer.

It is to be appreciated that in FIG. 2 the illustration of a particular order to the blocks does not necessarily imply that there is a required or preferred order for the blocks. The order and arrangement of the block may be varied for example, the electrically insulating material 29 may be deposited 17 before the contact portion 21 is deposited 15. Furthermore, it may be possible for some steps to be omitted for example, where the contact portions 21 and the electrically conductive material 31 are formed form the same material these blocks may be combined.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

We claim:

1. A method comprising:
   forming a recess using a focussed ion beam in a graphene layer wherein the recess creates a boundary between a first portion of the graphene layer and a second portion of the graphene layer, wherein the first portion comprises a nanoribbon, wherein the second portion comprises a nanoribbon, and wherein a width of each nanoribbon is between about 10 nm and about 150 nm;
   depositing electrically insulating material within the recess using a focussed ion beam; and
   depositing an electrically conductive material over the insulating material using a focussed ion beam.

2. A method as claimed in claim 1 comprising enabling an electrical connection to be made to the first portion of the graphene layer.

3. A method as claimed in claim 1 wherein the recess separates the first portion of the graphene layer from the second portion of the graphene layer.

4. A method as claimed in claim 1 wherein the recess surrounds the first portion of the graphene layer.

5. A method as claimed in claim 1 wherein the insulating material comprises an oxide.

6. A method as claimed in claim 5 wherein the insulating material comprises silicon dioxide.

7. A method as claimed in claim 1 wherein the electrically conductive material comprises chromium alloy.

8. A method as claimed in claim 1 comprising depositing a contact portion wherein the contact portion provides an electrical connection between the first portion of the graphene layer and the electrically conductive material.

9. A method as claimed in claim 8 wherein the contact portion comprises a different material to the electrically conductive material.

10. A method as claimed in claim 9 wherein the contact portion comprises palladium.

\* \* \* \* \*